United States Patent

Coussot

[11] 4,051,448
[45] Sept. 27, 1977

[54] SURFACE ACOUSTIC WAVE TRANSMISSION DEVICE AND METHOD OF MANUFACTURING SAME

[75] Inventor: Gerard Coussot, Paris, France

[73] Assignee: Thomson-CSF, Paris, France

[21] Appl. No.: 550,036

[22] Filed: Feb. 14, 1975

[30] Foreign Application Priority Data

Feb. 15, 1974 France .................. 74.05202

[51] Int. Cl.² .............. H03H 9/26; H03H 9/30; H03H 9/04; H01L 41/22
[52] U.S. Cl. ................ 333/30 R; 29/25.35; 310/312; 310/313; 310/366; 333/72
[58] Field of Search ............ 333/30 R, 72; 29/25.35; 310/8, 8.1, 8.2, 8.3, 9.4, 9.6, 9.8

[56] References Cited

U.S. PATENT DOCUMENTS

| 3,781,721 | 12/1973 | Judd et al. ................... 333/30 R |
| 3,878,407 | 4/1975 | Hartemann et al. ........... 333/30 R |
| 3,887,887 | 6/1975 | Wagers et al. ................ 333/30 R |

Primary Examiner—Saxfield Chatmon, Jr.
Assistant Examiner—Marvin Nussbaum
Attorney, Agent, or Firm—Cushman, Darby & Cushman

[57] ABSTRACT

The present invention relates to the manufacture of surface acoustic wave transmission devices. The invention provides a method of cutting the edges of surface acoustic wave devices, which consists in directing on to that face designed to propagate said waves, a jet of abrasive particles.

10 Claims, 2 Drawing Figures

SURFACE ACOUSTIC WAVE TRANSMISSION DEVICE AND METHOD OF MANUFACTURING SAME

The present invention relates to devices designed to propagate surface acoustic waves. These devices generally comprise a substrate cut in a piezo-electric wafer and upon which there are deposited electrodes of inter-digitated comb shaped design. These conductive comb shaped structures form, together with the substrate, electromechanical transducers designed to exchange surface acoustic waves, but must not, however receive vibrational energy reflected by the substrate edges. Means which enable the surface waves to be absorbed, can be arranged upon the substrate in order to surround the exchange zone located between the transducers, thus inhibiting the reflection of marginal waves. However, the addition of these absorber means prolongs manufacturing operations and leads to a structure which is more difficult to manufacture. In addition, the techniques of cutting the crystal wafer used to manufacture the substrate, may give rise to drawbacks. Cutting by means of a laser beam is slow and tends to depolarize the crystal. The use of a diamond saw results in relatively rapid wear of the cutting tool and is limited to straight line cutting operations. The use of a wire saw leaves deposits of abrasive material at the surface of the crystal and the transducer comb structures, and these deposits have to be removed later on.

In order to overcome these drawbacks, the invention proposes that cutting of the crystal should be effected by the use of a jet abrasive particles directed by a nozzle on to that face of the crystal at which the surface waves are to propagate. The ground and smoothed contour which results from this method of cutting; right from the start ensures attenuation of marginal reflections due to the scattering which the surface acoustic waves experience when reaching the scattering contour of the substrate.

In accordance with the invention there is provided a surface acoustic wave transmission device comprising: a substrate cut in a wafer and having at least one smooth face for propagating said waves, the edge of said substrate located on the trajectory of said waves, being a ground scattering edge obtained from the cutting of said wafer with a jet of abrasive particles directed on to said smooth face; said ground scattering edge having a mean rounded profile fitting together with said smooth face.

The invention likewise relates to a method of manufacturing a surface acoustic wave device comprising a substrate cut in a wafer having at least one smooth face designed for the propagation of said waves, the method comprises the steps of cutting, profiling and grinding the edges of said substrate in one operation, by the use of a jet abrasive particles directed on to said smooth face; the point of impact of said jet being displaced in relation to said smooth face in accordance with the cut it is required to produce.

For a better understanding of the present invention and to show how the same may be carried into effect reference will be made to the ensuring description and the attached figures among which:

The invention is concerned with the manufacture of substrates which are capable of transmitting surface acoustic waves such as Rayleigh waves. These substrates can be cut in piezo-electric wafers, in which case electrodes of inter-digitated comb shaped design are used to emit or receive the surface acoustic waves, although the invention is equally applicable to wafers formed of different materials, in situations where the surface acoustic waves are excited by other electromechanical transducers, possibly associated with coupling prisms which effect suitable conversion of the vibrational modes.

Figure 1:
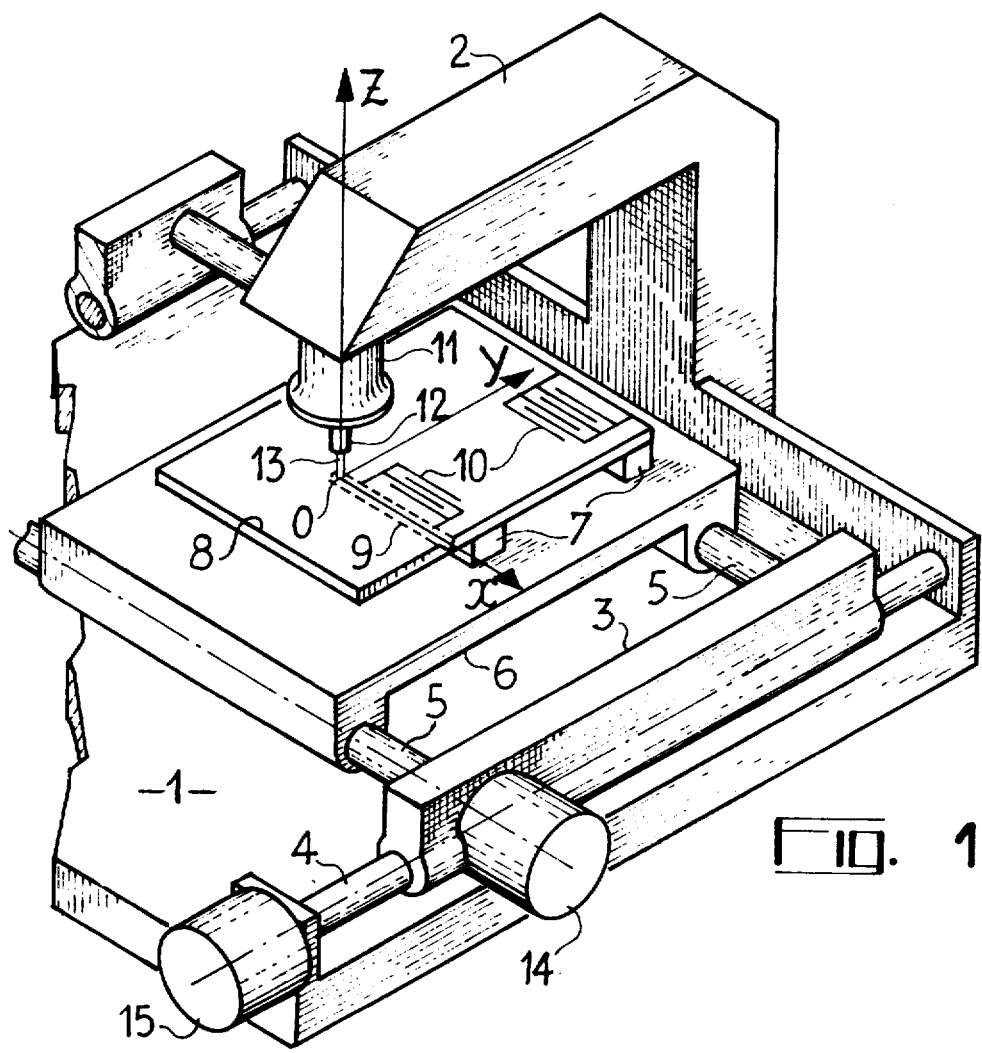
FIG. 1 is an isometric view of the device in accordance with the invention and of the apparatus used to cut it.

In FIG. 1, by way of non-limitative example there can be seen a piezo-electric wafer of lithium niobate at the surface 8 of which there have been deposited two sets of electrodes 10 of inter-digitated comb shaped design. These electrodes form, with the piezo-electric wafer, two electromechanical transducers capable of exchanging surface acoustic waves. Since the teeth of the comb structures are orientated in the direction OX on the face 8, the propagation of the waves takes place in a directional fashion, in fact in the direction OY of the face 8, perpendicular to OX; the axis OZ is perpendicular to the face 8. The cutting of the wafer in accordance with the axes OX and OY makes it possible to produce a complete surface acoustic wave device which can be utilised, as required, either as a delay line or a filter. By multiplying the numbers of electrode deposits and by carrying out other cutting operations on the wafer, several similar devices can be manufactured.

The apparatus used to cut the wafer is essentially constituted by a base 1 to which there are attached guide bars carrying a moving carriage 3. One of the guide bars 4 can be screwed over its length so that by arranging for a motor 15 to rotate it, a straight-line displacement on the part of the carriage 3 parallel to the axis OY is produced. The carriage 3 is itself equipped with supporting bars 5 upon which there can slide a table whose rectilinear displacement parallel to the axis OX is controlled likewise by a motor 14. On the table 6, the wafer for cutting is fixed by means of spacers 7 located outside the path of cut. A bracket 2 fixed to the base 1 carries at its free end a nozzle 12 with an axis OZ, and, around same, a suction head 11. The nozzle 12 is connected to a reservoir of abrasive particles through which gas flow is made to pass in order to entrain said particles. At the exit of the nozzle 12, a jet 13 of abrasive particles is produced which particles, after having struck the face 8 of the wafer being cut, are sucked away by the suction head 11 which communicates with an exhauster.

By way of example, the jet 13 will be a jet of compressed air emitted by a nozzle 12 having a bore size of two-tenths of a millimeter. This jet carries said particles having a size of 50 microns and is used to cut a lithium niobate substrate designed to transmit surface acoustic waves of frequencies ranging between 30 and 40 MHz. The control of the X and Y displacement of the table 6 makes it possible to choose any required line of cut in the plane of the face 8. The speed of cut is in the order of 2 to 10 mm per minute depending upon the nature and thickness of the wafer.

Without departing from the scope of the invention, it is equally possible to use a fixed table and device for projecting the abrasive particles which is mobile, in two directions perpendicular to the jet axis. It is equally possible to incline the jet in relation to the face 8 of the wafer being cut but in the case of normal incidence, the profile of the cut is symmetrical.

The advantage of the cutting technique in accordance with the invention is not solely that it makes it possible to follow an undulating contour automatically and uninterruptedly. It also has to be borne in mind that cutting takes place in the dry and without heating the substrate. It is therefore not necessary to clean the surface of the substrate after cutting and the risk of fracture or modification of the electromechanical characteristics of the substrate, is avoided.

Figure 2:
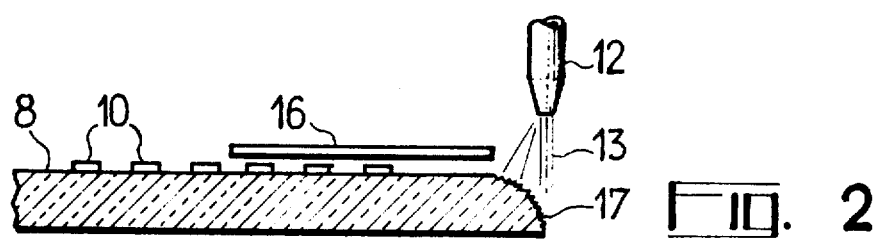
FIG. 2 is a partial section through the device in accordance with the invention.

An important advantage of the method of cutting proposed accordance with the invention lies in the surface finish and profile of the cut edges of the substrate. The cut substrate has been shown in partial section in FIG. 2, along with the nozzle 12 and the sand jet 13. It will be seen that the mean profile of the cut edge of the substrate has a radiused form which merges with the face 8 through which the surface acoustic waves are transmitted. In addition to its radiused shape, the edge 20 of the substrate has a ground zone 17 the grain of which is related to the grain size of the abrasive particles used. This ground zone 17 extends down to the base of the cut and joins the surface 8 at a point which depends upon the angle of dispersion of the abrasive particles in the jet 13. A protective screen 16 can be provided during the cutting operation in order to prevent stray particles from reaching the electrodes 10 on the face 8.

It surface waves are transmitted towards the edge 17, moving from the left to right along the face 8, at the ground zone they experience intense scattering in all directions, so that they are not reflected. If the size of the protuberances of high-spots in the ground zone, is of the same order of magnitude as the wavelength of the surface waves, then a a distance of only a few wavelengths is sufficient to substantially scatter the vibrational energy. The attenuation of the surface waves is thus very effectively ensured mainly by the use of the sand jet for the cutting operation.

The attenuation of the surface acoustic waves by the edges cut using the sand jet, is an effective advantage if the cut edges are located in the path of the surface waves. Certain edges may not be touched by the waves, due to the directional nature of the vibrational radiation emitted by the transducers. However, even if the advantage pertaining to echo attenuation is not exploited over the whole length of a cut, it must be borne in mind that the method of cutting in accordance with the invention nevertheless secures the other advantages already referred to earlier.

It goes without saying that cutting by the use of a sand jet can be carried out simultaneously by means of two jets designed to meet one another and by displacing the wafer at the point of intersection of the two jets. In this case, two nozzles must be provided, with converging axes, the nozzles being assembled at the ends of a fork; the mounting table must then be opened out in order to pass one of the two jets. This solution makes it possible to increase the rate of cut. It also makes it possible to achieve attenuation of surface elastic waves in situations where the latter are intended to propagate along both faces of the wafer being cut. The utilisation of abrasive particles of elongated section in the direction of cut, is conceivable in the case of straight-line cuts. By changing the alignment of the elongated section of the jet in relation to the direction of cut, it is possible to arbitrarily widen the area subjected to abrasion.

What I claim is:

1. Surface acoustic wave transmission device comprising: a substrate having at least one smooth face for propagating said waves, the edge of said substrate located on the trajectory of said waves, being a ground scattering edge resulting from cutting said edge in a wafer using a jet of abrasive particles directed on to said smooth face; the mean profile of said ground scattering edge having a radiused form merging in said smooth face.

2. Transmission device as claimed in claim 1, wherein said substrate is cut in a wafer of piezo-electric material and coated with at least two sets of electrodes of interdigitated comb shaped design, designed to emit and receive said surface acoustic waves.

3. Transmission device as claimed in claim 2, wherein said sets of electrodes are located on one and the same face of said substrate.

4. Transmission device as claimed is claim 2, wherein one of said sets is located on one main face of said substrate; the other of said sets is located on the other main face of said substrate, opposite said first main face; said main faces being connected to one another at one end of the substrate, by an edge whose surface is not ground whereby ensuring continuity of transmission of said surface elastic waves from one to the other of said main faces.

5. Method of manufacturing a surface acoustic wave device comprising a substrate having at least one smooth face designed to propagate said waves, said method comprising the steps of selecting a wafer, and of cutting, in said wafer the edges of said substrate using a jet of abrasive particles reaching said smooth face at a narrow zone of impact; said jet being displaced in relation to said smooth face for causing said zone of impact to follow within said smooth face, the line of cut which is to be produced; said cutting resulting in a radiused form of the mean profile of said edges, said radiused form merging in said smooth face, and said edges having ground zones produced by said abrasive particles.

6. Method as claimed in claim 5, wherein cutting is effected by means of two jets having converging axes, and reaching said smooth face and a face of said substrate opposite said smooth face at two narrow zones of impact; said wafer being displaced in relation to the point of intersection of said axes for causing said zones of impact to follow said line of cut.

7. Method as claimed in claim 5, wherein said jet is directed perpendicularly on to said smooth face.

8. Method as claimed in claim 5, wherein the section of said jet is substantially circular.

9. Method as claimed in claim 5, wherein the section of said jet is elongated and can be orientated in relation to the direction of cut.

10. Method as claimed in claim 5, wherein said abrasive particles are sand particles.

* * * * *